(12) United States Patent
Inumiya et al.

(10) Patent No.: US 10,985,104 B2
(45) Date of Patent: Apr. 20, 2021

(54) SEMICONDUCTOR DEVICE HAVING ELECTRODE PAD AND ELECTRODE LAYER INTERVENING SEMICONDUCTOR LAYER INBETWEEN AND MANUFACTURING METHOD THEREOF

(71) Applicants: Kabushiki Kaisha Toshiba, Tokyo (JP); Toshiba Electronic Devices & Storage Corporation, Tokyo (JP)

(72) Inventors: Seiji Inumiya, Kanazawa Ishikawa (JP); Kyoichi Suguro, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/998,401

(22) Filed: Aug. 15, 2018

(65) Prior Publication Data

US 2019/0295957 A1  Sep. 26, 2019

(30) Foreign Application Priority Data

Mar. 23, 2018 (JP) ............................. JP2018-055445

(51) Int. Cl.
*H01L 23/532* (2006.01)
*H01L 23/373* (2006.01)
(Continued)

(52) U.S. Cl.
CPC .......... *H01L 23/53233* (2013.01); *C25D 3/38* (2013.01); *C25D 5/02* (2013.01);
(Continued)

(58) Field of Classification Search
CPC ......... H01L 23/53233; H01L 21/76843; H01L 21/283; H01L 29/7395; H01L 29/1079;
(Continued)

(56) References Cited

U.S. PATENT DOCUMENTS 5,760,418 A  6/1998 Lee et al.
7,545,040 B2  6/2009 Ueki et al.
(Continued)

FOREIGN PATENT DOCUMENTS

JP  2002-124523 A  4/2002
JP  2004-071886 A  3/2004
(Continued)

OTHER PUBLICATIONS

Biselli et al. "Microstructure and Strength of Cu—Fe in Situ Composites After Very High Drawing Strains", Acta Mater, vol. 44, No. 2, pp. 493-504, 1996 (Year: 1996).*

*Primary Examiner* — Sonya McCall-Shepard
(74) *Attorney, Agent, or Firm* — White & Case LLP

(57) ABSTRACT

A semiconductor device according to an embodiment includes a first electrode pad containing copper as a main component and having a thickness equal to or more than 5 µm and less than 50 µm; an electrode layer containing copper as a main component and having a thickness equal to or more than 5 µm and less than 50 µm; and a semiconductor layer provided between the first electrode pad and the electrode layer.

15 Claims, 14 Drawing Sheets

(51) Int. Cl.
*H01L 27/24* (2006.01)
*H01L 29/10* (2006.01)
*H01L 29/739* (2006.01)
*H01L 23/00* (2006.01)
*C25D 3/38* (2006.01)
*H01L 21/283* (2006.01)
*C25D 5/02* (2006.01)
*H01L 21/768* (2006.01)

(52) U.S. Cl.
CPC ...... *H01L 21/283* (2013.01); *H01L 21/76843* (2013.01); *H01L 23/3736* (2013.01); *H01L 27/2454* (2013.01); *H01L 29/1079* (2013.01); *H01L 29/7395* (2013.01); *H01L 2224/0603* (2013.01); *H01L 2224/08058* (2013.01)

(58) Field of Classification Search
CPC ... H01L 29/7393–7398; H01L 2224/02; H01L 2224/03; H01L 2224/04; H01L 2224/05; H01L 2224/06; H01L 2224/07–09; H01L 2224/04026; H01L 2224/0508; H01L 2224/05147; H01L 2224/05247; H01L 2224/05001; H01L 2224/05005; H01L 2224/0501; H01L 2224/0502; H01L 2224/0554; H01L 2224/05541; H01L 2224/0555; H01L 2224/0556–05566; H01L 2224/05647; H01L 2224/06519; H01L 2224/08053; H01L 2224/08058; H01L 2224/08145; H01L 2224/0903; H01L 23/28; H01L 23/31; H01L 23/3107; H01L 23/3157; H01L 23/3114; H01L 23/34; H01L 23/36; H01L 23/367; H01L 23/373; H01L 23/42; H01L 27/24; H01L 27/2409; H01L 27/2436; H01L 27/2454; H01L 27/2463; H01L 27/2481; H01L 27/249; H01L 27/7827; H01L 23/48; H01L 23/488; H01L 23/498; H01L 29/41741; C25D 5/02; C25D 3/38
See application file for complete search history.

(56) References Cited

U.S. PATENT DOCUMENTS

| | | | |
|---|---|---|---|
| 7,947,586 | B2 | 5/2011 | Urano |
| 8,283,051 | B2 | 10/2012 | Ito et al. |
| 8,502,274 | B1* | 8/2013 | Matoy ................... H01L 23/528 257/208 |
| 8,907,407 | B2 | 12/2014 | Oikawa |
| 2008/0006897 | A1* | 1/2008 | Inaguchi ................. G01K 7/22 257/467 |
| 2010/0013008 | A1 | 1/2010 | Oikawa |
| 2015/0068596 | A1* | 3/2015 | Ibara ............... H01L 31/022433 136/256 |
| 2015/0200178 | A1* | 7/2015 | Otremba ................ H01L 24/32 257/660 |
| 2015/0357424 | A1* | 12/2015 | Kitao ................ H01L 29/66734 257/334 |
| 2017/0092596 | A1* | 3/2017 | Yoshihara ........... H01L 21/4839 |
| 2017/0263712 | A1* | 9/2017 | Siemieniec ............. H01L 23/34 |
| 2017/0278706 | A1* | 9/2017 | Oda ..................... H01L 29/7395 |

FOREIGN PATENT DOCUMENTS

| | | |
|---|---|---|
| JP | 2010-92895 A | 4/2010 |
| JP | 4591084 B2 | 12/2010 |
| JP | 2011-077460 A | 4/2011 |
| JP | 5045613 B2 | 10/2012 |
| JP | 5300156 B2 | 9/2013 |
| JP | 5428362 B2 | 2/2014 |
| WO | 2015-029152 A1 | 3/2015 |

* cited by examiner

AA' CROSS SECTION

BB' CROSS SECTION

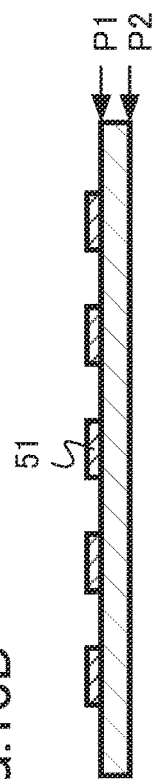
FIG.13A
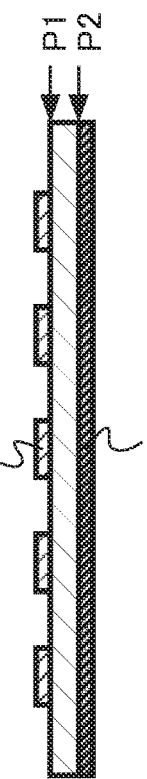
FIG.13B
FIG.13C
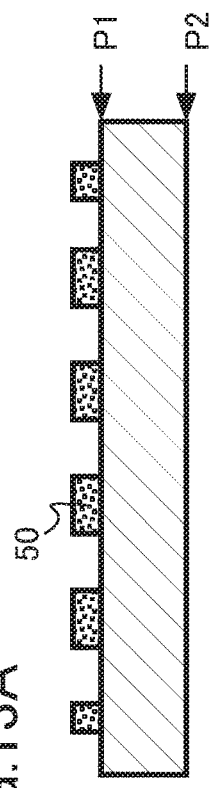
FIG.13D
FIG.13E
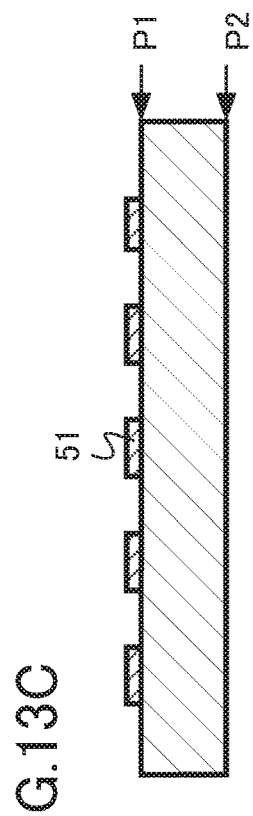
FIG.13F

SEMICONDUCTOR DEVICE HAVING ELECTRODE PAD AND ELECTRODE LAYER INTERVENING SEMICONDUCTOR LAYER INBETWEEN AND MANUFACTURING METHOD THEREOF

CROSS-REFERENCE TO RELATED APPLICATION

This application is based upon and claims the benefit of priority from Japanese Patent Application No. 2018-055445, filed on Mar. 23, 2018, the entire contents of which are incorporated herein by reference.

FIELD

Embodiments described herein relate generally to a semiconductor device and a semiconductor device manufacturing method.

BACKGROUND

A power semiconductor device has a problem that a rise in a temperature caused by heat generation of a semiconductor chip causes a degradation in reliability. For example, the heat generation may vary a threshold voltage of a transistor and destabilize a device operation. Furthermore, the heat generation may breakdown the device.

To suppress a rise in the temperature caused by heat generation, copper having high thermal conductivity is used for electrodes provided on top planes of semiconductor chips. The copper electrodes cool semiconductor chip, and suppress a rise in a temperature caused by heat generation of the semiconductor chips.

It is desirable to increase the thickness of the copper used for the electrodes to enhance an effect of cooling the semiconductor chips. However, increasing the thickness of the copper increases stresses of the electrodes and makes warps of the semiconductor chips large. The warps of the semiconductor chips may produce cracks in the semiconductor chips or produce voids in solders used as bonding layers.

BRIEF DESCRIPTION OF THE DRAWINGS

FIGS. 13A, 13B, 13C, 13D, 13E and 13F are views illustrating the semiconductor device manufacturing method according to the third embodiment.

DETAILED DESCRIPTION

Figure 1:
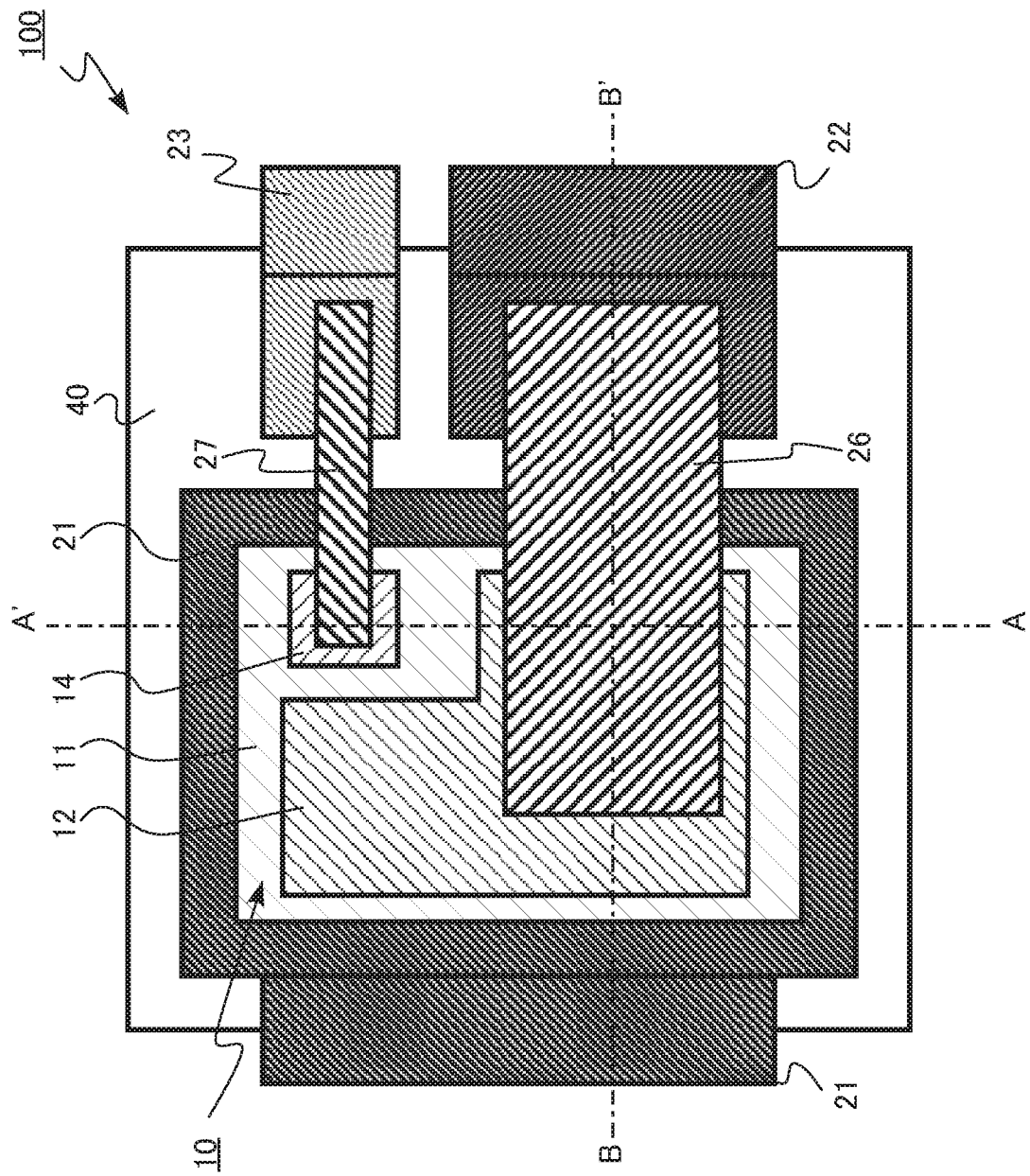
FIG. 1 is a schematic top view of a semiconductor device according to a first embodiment.

The same or similar members in this description will be assigned the same reference numerals, and overlapping description will be omitted in some cases.

In this description, an upper direction in the drawings will be referred to as an "upper side" and a lower direction in the drawings will be referred to as a "lower side" to indicate a positional relationship between parts. In this description, concepts of the "upper side" and the "lower side" are not necessarily terms indicating a relationship with a gravitational direction.

Types of elements that consist an electrode disclosed in this description can be measured by, for example, a SIMS (Secondary Ion Mass Spectrometry) or an EDX (Energy Dispersive X-ray Spectroscopy). Furthermore, a distribution of the additional elements in the electrode can be identified based on the EDX, for example. Furthermore, a length such an electrode thickness can be measured by, for example, a SEM (Scanning Electron Microscopy) or a TEM (Transmission Electron Microscopy).

In this description, a metal containing copper as a main component means a metal in which the atom ratio occupied by the copper is the largest among total elements consisting the metal. In this description, the metal containing the copper as the main component is, for example, a metal in which the atom ratio occupied by the copper is 90% or more.

First Embodiment

A semiconductor device according to the first embodiment includes: a first electrode pad containing copper (Cu) as a main component and having a thickness equal to or more than 5 μm and less than 50 μm; an electrode layer containing copper as a main component and having a thickness equal to or more than 5 μm and less than 50 μm; and a semiconductor layer provided between the first electrode pad and the electrode layer.

The semiconductor device according to the first embodiment is a semiconductor chip 10 or a semiconductor package 100. The semiconductor chip 10 is a power semiconductor chip used for power control and power supply. Furthermore, the semiconductor package 100 is a power semiconductor package including the semiconductor chip 10.

Figure 2A:
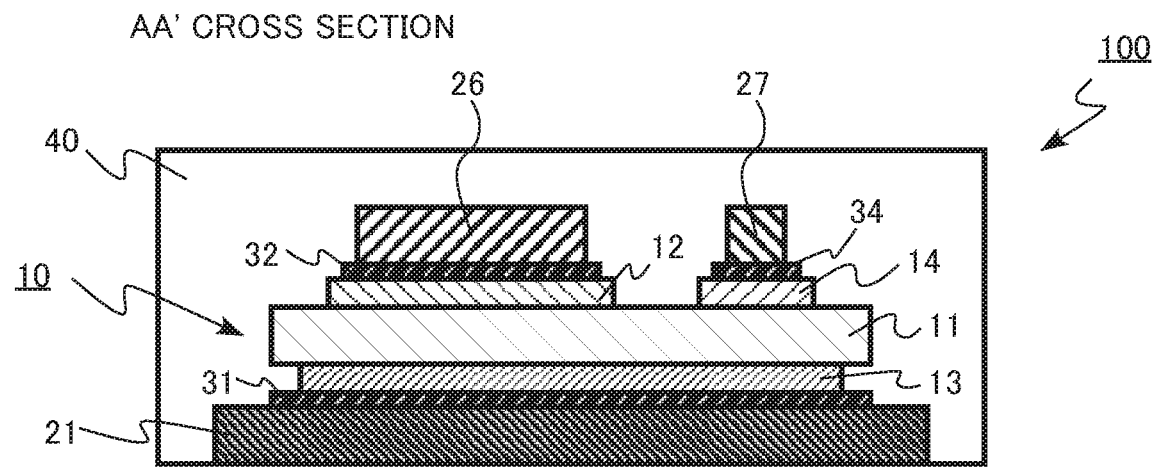
FIGS. 2A and 2B are schematic cross-sectional views of the semiconductor device according to the first embodiment.
Figure 2B:
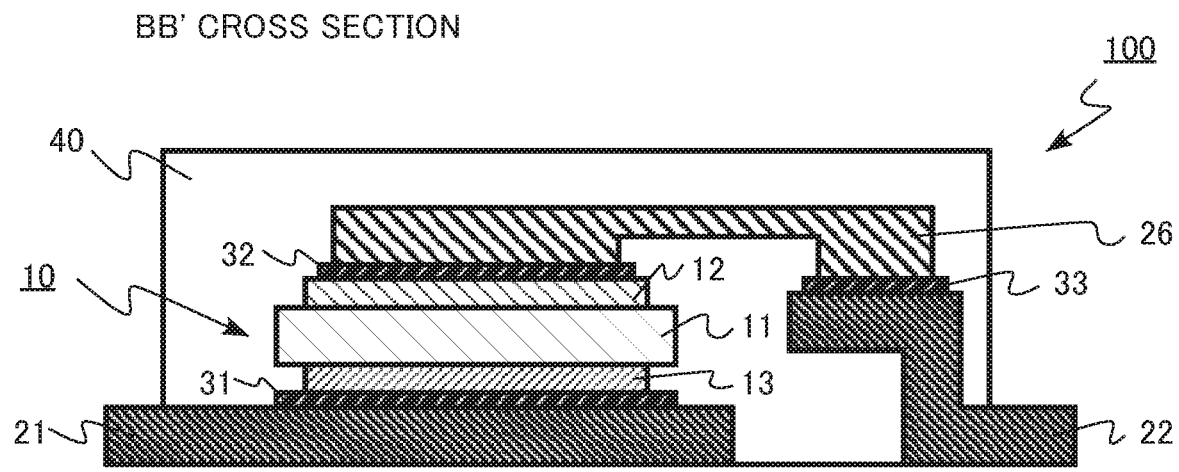

FIG. 1 is a schematic top view of the semiconductor device according to the first embodiment. FIGS. 2A and 2B are schematic cross-sectional views of the semiconductor device according to the first embodiment. FIG. 2A is an AA' cross-sectional view of FIG. 1. FIG. 2B is a BB' cross-sectional view of FIG. 1.

The semiconductor package 100 includes the semiconductor chip 10, a drain lead 21, a source lead 22, a gate lead 23, a source connector 26, a gate connector 27, a first bonding layer 31, a second bonding layer 32, a third bonding layer 33, a fourth bonding layer 34 and a molding resin 40.

The semiconductor chip 10 includes a semiconductor layer 11, a source electrode pad 12 (first electrode pad), a drain electrode 13 (electrode layer) and a gate electrode pad 14 (second electrode pad). The semiconductor chip 10 is, for example, a vertical power metal oxide field effect transistor (MOSFET).

The source electrode pad 12 is an example of the first electrode pad. The drain electrode 13 is an example of an electrode layer. The gate electrode pad 14 is an example of the second electrode pad.

The drain lead 21 is a metal of a plate shape. The drain lead 21 is, for example, a metal containing copper as a main component. The drain lead 21 is, for example, pure copper or copper alloy. The drain lead 21 is an example of a first electrode terminal. A lower plane of the drain lead 21 is exposed from, for example, a lower plane of the molding resin 40.

The source lead 22 is a metal. The source lead 22 is, for example, a metal containing copper as a main component. The source lead 22 is, for example, pure copper or copper alloy.

The gate lead 23 is a metal. The gate lead 23 is, for example, a metal containing copper as a main component. The gate lead 23 is, for example, pure copper or copper alloy.

The semiconductor chip 10 is provided on the drain lead 21.

The first bonding layer 31 is provided between the drain lead 21 and the semiconductor chip 10. The first bonding layer 31 bonds the drain lead 21 and the semiconductor chip 10. The first bonding layer 31 is, for example, a solder. The first bonding layer 31 electrically connects the drain lead 21 and the drain electrode 13.

The source connector 26 is provided on the semiconductor chip 10. The source connector 26 is a metal. The source connector 26 is, for example, a metal containing copper as a main component. The source connector 26 is, for example, pure copper or copper alloy.

The second bonding layer 32 is provided between the semiconductor chip 10 and the source connector 26. The second bonding layer 32 bonds the semiconductor chip 10 and the source connector 26. The second bonding layer 32 is, for example, a solder. The second bonding layer 32 electrically connects the source electrode pad 12 and the source connector 26.

The source connector 26 is provided on the source lead 22. The third bonding layer 33 is provided between the source connector 26 and the source lead 22. The third bonding layer 33 bonds the source lead 22 and the source connector 26. The third bonding layer 33 is, for example, a solder.

The third bonding layer 33 electrically connects the source connector 26 and the source lead 22. The source electrode pad 12 is electrically connected to the source lead 22 via the second bonding layer 32, the source connector 26 and the third bonding layer 33.

The gate connector 27 is provided on the semiconductor chip 10. The gate connector 27 is a metal. The gate connector 27 is, for example, a metal containing copper. The gate connector 27 is, for example, pure copper or copper alloy.

The fourth bonding layer 34 is provided between the semiconductor chip 10 and the gate connector 27. The fourth bonding layer 34 bonds the semiconductor chip 10 and the gate connector 27. The fourth bonding layer 34 is, for example, a solder. The fourth bonding layer 34 electrically connects the gate electrode pad 14 and the gate connector 27.

The gate connector 27 is provided on the gate lead 23. An unillustrated fifth bonding layer is provided between the gate connector 27 and the gate lead 23. The fifth bonding layer bonds the gate lead 23 and the gate connector 27. The fifth bonding layer is, for example, a solder.

The fifth bonding layer electrically connects the gate connector 27 and the gate lead 23. The gate electrode pad 14 is electrically connected to the gate lead 23 via the fourth bonding layer 34, the gate connector 27 and the fifth bonding layer.

The molding resin 40 surrounds the semiconductor chip 10, the source connector 26 and the gate connector 27. The molding resin 40 is, for example, an epoxy resin.

Figure 3:
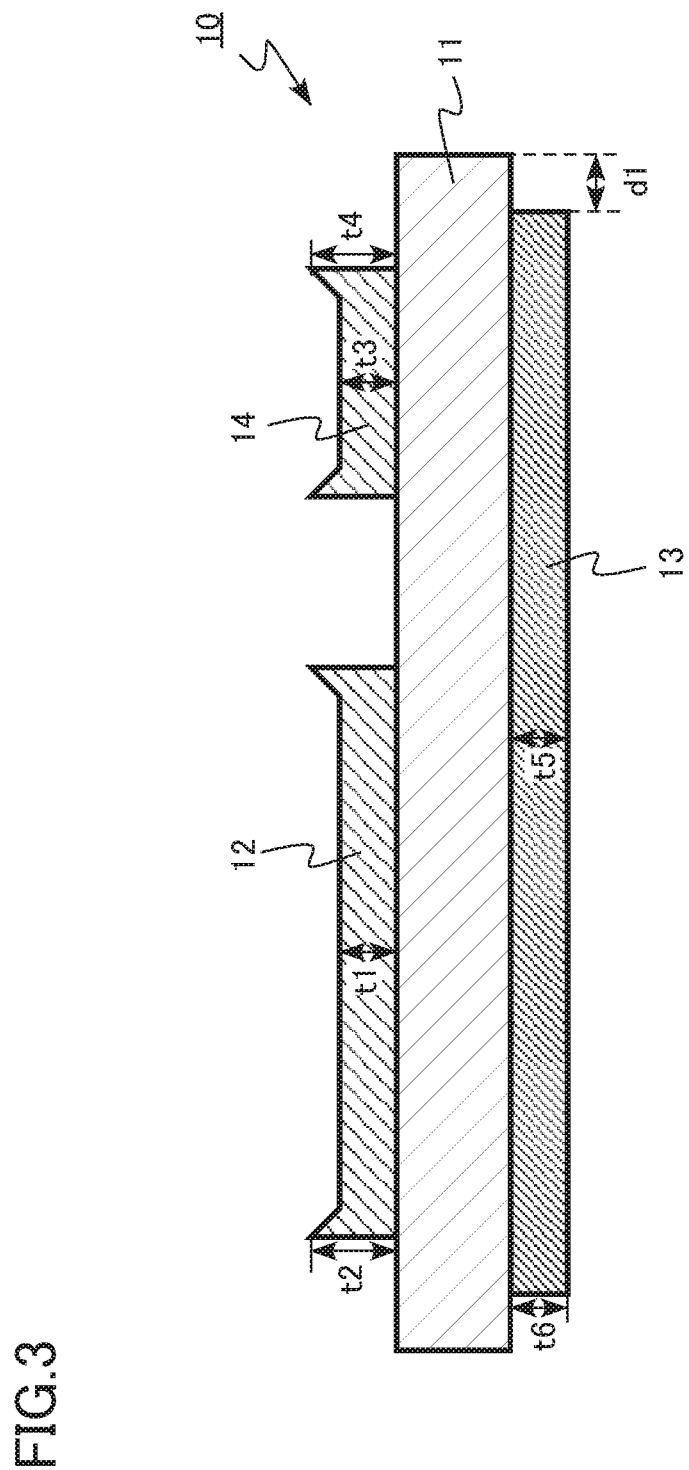
FIG. 3 is a schematic cross-sectional view of the semiconductor device according to the first embodiment.

FIG. 3 is a schematic cross-sectional view of the semiconductor device according to the first embodiment. FIG. 3 is a view illustrating details of the semiconductor chip 10.

The semiconductor layer 11 is a single crystal semiconductor. The semiconductor layer 11 is, for example, single crystal silicon, single crystal silicon carbide (SiC) or a single crystal nitride semiconductor.

The semiconductor layer 11 is provided between the source electrode pad 12 and the drain electrode 13. The semiconductor layer 11 is provided between the gate electrode pad 14 and the drain electrode 13.

The source electrode pad 12 is a metal containing copper as a main component. The source electrode pad 12 is, for example, pure copper. The thickness (t1 in FIG. 3) of a center of the source electrode pad 12 is equal to or more than 5 μm and less than 50 μm.

The thickness (t2 in FIG. 3) of an end of the source electrode pad 12 is, for example, thicker than the thickness t1 of the center of the source electrode pad 12. The thickness t2 of the end of the source electrode pad 12 is, for example, 1.1 times or more and 1.5 times or less as the thickness t1 of the center of the source electrode pad 12.

The gate electrode pad 14 is a metal containing copper as a main component. The gate electrode pad 14 is, for example, pure copper. The thickness (t3 in FIG. 3) of a center of the gate electrode pad 14 is equal to or more than 5 μm and less than 50 μm.

The thickness (t4 in FIG. 3) of an end of the gate electrode pad 14 is, for example, thicker than the thickness t3 of the center of the gate electrode pad 14. The thickness t4 of the end of the gate electrode pad 14 is, for example, 1.1 times or more and 1.5 times or less as the thickness t3 of the center of the gate electrode pad 14.

The drain electrode 13 is a metal containing copper as a main component. The drain electrode 13 is, for example, pure copper. The thickness (t5 in FIG. 3) of a center of the drain electrode 13 is equal to or more than 5 μm and less than 50 μm.

The thickness (t6 in FIG. 3) of an end of the drain electrode 13 is, for example, the substantially same as the thickness t5 of the center of the drain electrode 13. The thickness t6 of the end of the drain electrode 13 is the same in a tolerance range of the thickness t5 of the center of the drain electrode 13. The drain electrode 13 has, for example, the entirely uniform thickness.

The end of the drain electrode 13 is closer to an inside by a predetermined distance (d1 in FIG. 3) than an end of the semiconductor layer 11. The predetermined distance d1 is, for example, 15 µm or more and 115 µm or less.

For example, an unillustrated interlayer insulating film is provided on the semiconductor layer 11. The interlayer insulating film is, for example, an oxide film, a nitride film, an oxynitride film or a resin film. The interlayer insulating film is, for example, a stacked film of an oxide silicon film and a polyimide film.

For example, an unillustrated source electrode is provided between the source electrode pad 12 and the semiconductor layer 11. The source electrode is, for example, a metal different from copper. The source electrode is a metal containing aluminum as a main component. The source electrode is in contact with, for example, the semiconductor layer 11.

For example, an unillustrated barrier metal layer is provided between the source electrode and the source electrode pad 12. The barrier metal layer is, for example, a metal or a metal nitride. The barrier metal layer is, for example, titanium, tantalum, titanium nitride, tantalum nitride and tungsten nitride.

In addition, the source electrode pad 12 may be provided on the semiconductor layer 11 without the source electrode. In this case, for example, an unillustrated barrier metal layer is provided between the semiconductor layer 11 and the source electrode pad 12. The barrier metal layer is, for example, a metal or a metal nitride. The barrier metal layer is, for example, titanium, tantalum, titanium nitride, tantalum nitride and tungsten nitride.

For example, an unillustrated gate electrode is provided between the gate electrode pad 14 and the semiconductor layer 11. The gate electrode is, for example, a polycrystalline semiconductor. The gate electrode is, for example, polycrystalline silicon.

For example, an unillustrated barrier metal layer is provided between the gate electrode and the gate electrode pad 14. The barrier metal layer is, for example, a metal or a metal nitride. The barrier metal layer is, for example, titanium, tantalum, titanium nitride, tantalum nitride and tungsten nitride.

Next, an example of the semiconductor device manufacturing method according to the first embodiment will be described.

The semiconductor device manufacturing method according to the first embodiment includes: processing a semiconductor substrate including a first plane and a second plane, a center portion of the semiconductor substrate on a side of the second plane being made thin to leave surrounding portion thick; forming a resist pattern on a side of the first plane; and simultaneously forming a first metal film on a side of the first plane and a second metal film on a side of the second plane by an electroplating method by using an electroplating device, the first metal film containing copper (Cu) as a main component and having a thickness equal to or more than 5 µm and less than 50 µm, and the second metal film containing the copper as the main component and having a thickness equal to or more than 5 µm and less than 50 µm.

Figure 4A:
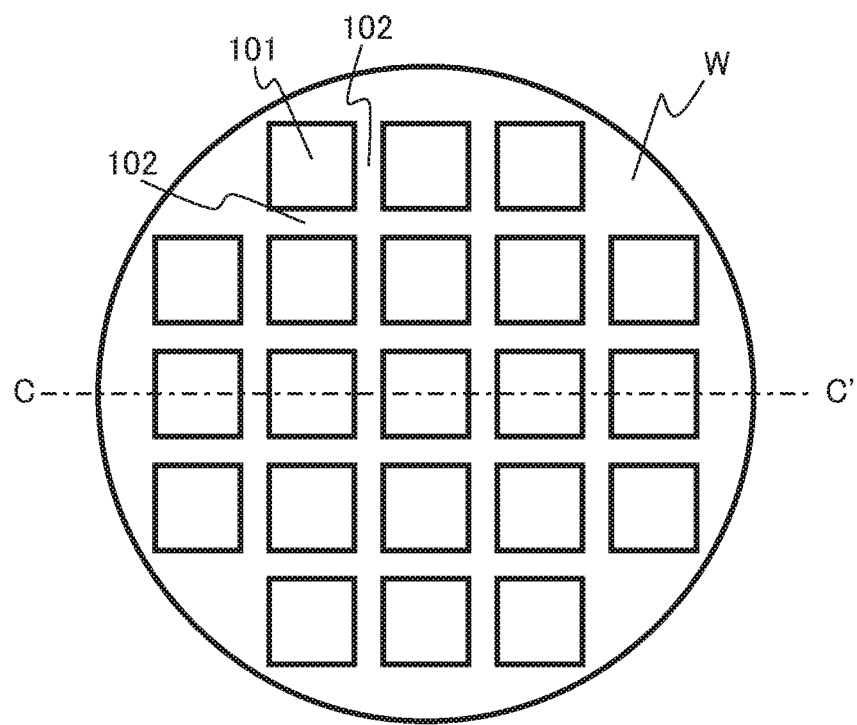
FIGS. 4A and 4B are views illustrating a semiconductor device manufacturing method according to the first embodiment.
Figure 4B:
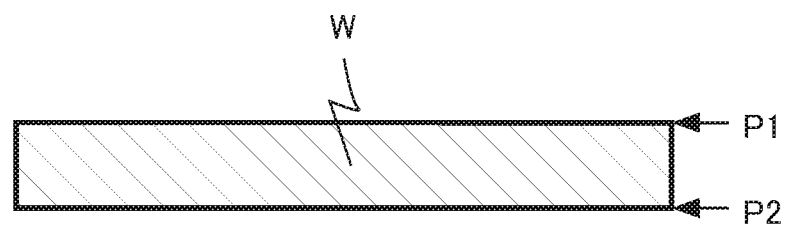

FIGS. 4A, 4B, 5A, 5B, 5C, 5D, 5E, 5F and 5G are views illustrating the semiconductor device manufacturing method according to the first embodiment. FIG. 4A is a top view of the semiconductor device being manufactured. FIG. 4B is a CC' cross-sectional view in FIG. 4A. FIGS. 5A, 5B, 5C, 5D, 5E, 5F and 5G are cross-sectional views illustrating the semiconductor device being manufactured.

A plurality of MOSFETs 101 is formed on a silicon substrate W (FIGS. 4A and 4B). The silicon substrate W is an example of the semiconductor substrate. The silicon substrate W includes a first plane P1 and a second plane P2. Hereinafter, the first plane P1 will be referred to as a top plane, and the second plane P2 will be referred to as a back plane. The thickness of the silicon substrate W is, for example, 750 µm.

A dicing line 102 having a predetermined width to be cut by dicing later is provided between the MOSFETs 101. A stacked protection film of an unillustrated oxide silicon film and polyimide film is formed on the top plane of the silicon substrate W.

The unillustrated source electrode and gate electrode are exposed from an opening of the stacked protection film. The source electrode and the gate electrode are metals containing aluminum as main components. The silicon substrate W from which the stacked protection film is removed is exposed on the dicing line 102.

An unillustrated barrier metal layer and seed layer are formed on the top plane of the silicon substrate W. The barrier metal layer and the seed layer are deposited by a physical vapor deposition method (PVD method). For example, the barrier metal layer is titanium whose thickness is 150 nm, and the seed layer is copper whose thickness is 500 nm.

Figure 5A:
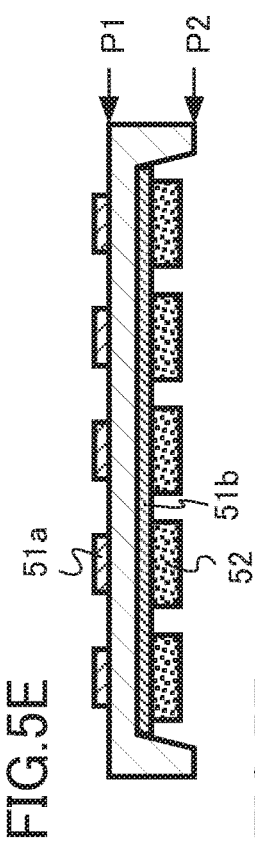
FIGS. 5A, 5B, 5C, 5D, 5E, 5F, 5G and 5H are views illustrating the semiconductor device manufacturing method according to the first embodiment.

Next, the center portion of the back plane side of the silicon substrate W is made thin to leave surrounding portion of the silicon substrate W thick. More specifically, the top plane of the silicon substrate W is protected by an unillustrated back grind tape. In this state, the back plane side of a portion except approximately 3 mm of the surroundings of the silicon substrate W is grinded (FIG. 5A). For example, the thickness of the silicon substrate W is grinded to 65 µm.

Next, silicon on the back plane side is wet-etched by, for example, 15 µm. A mixed acid is used for wet etching. The silicon on the back plane is wet-etched to remove a damage caused by the grinding.

An unillustrated barrier metal layer and seed layer are formed on the back plane of the silicon substrate W. The barrier metal layer and the seed layer are deposited by the PVD method. For example, the barrier metal layer is titanium whose thickness is 150 nm, and the seed layer is copper whose thickness is 500 nm. In addition, before the barrier metal layer is deposited, a dilute hydrofluoric acid process is preferably performed to remove a natural oxide film.

Figure 5B:
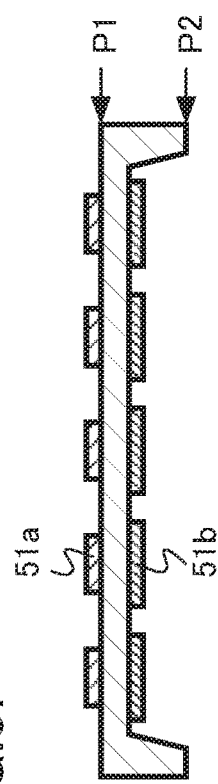

Next, the back grind tape on the top plane is removed. Next, a lithography method is used to form a resist pattern 50 on the top plane of the silicon substrate W (FIG. 5B). A resist film thickness is, for example, 25 µm. The resist pattern 50 includes openings formed on the source electrode and the gate electrode on the top plane of the silicon substrate W.

Figure 5C:
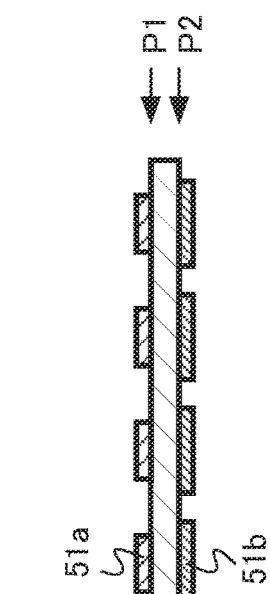

Next, the electroplating method using the electroplating device forms first copper plated films 51a (first metal films) on the source electrode and the gate electrode on the top plane of the silicon substrate W. Simultaneously, a second copper plated film 51b (second metal film) is formed on the back plane of the silicon substrate W (FIG. 5C). The thicknesses of the first copper plated films 51a and the second copper plated film 51b are, for example, 20 µm.

The first copper plated films 51a become the source electrode pad 12 and the gate electrode pad 14. The second copper plated film 51b becomes the drain electrode 13.

Figure 5D:
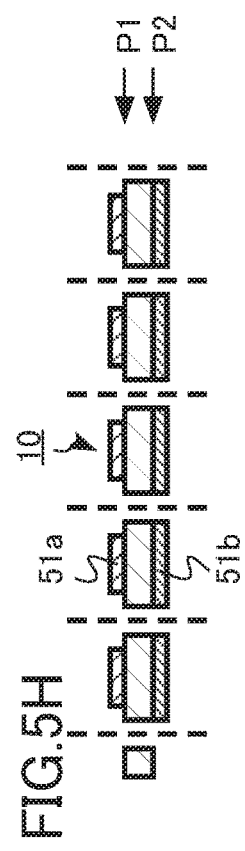

Next, the resist pattern 50 on the top plane of the silicon substrate W is removed by an organic solvent (FIG. 5D). Next, a copper seed layer covered by the resist pattern 50 on the top plane of the silicon substrate W is removed. Next, a potassium hydroxide hydrogen peroxide solution is used to remove a titanium barrier metal layer. The seed layer and the barrier metal layer are removed to electrically separate the source electrode pad 12 and the gate electrode pad 14.

Figure 5E:
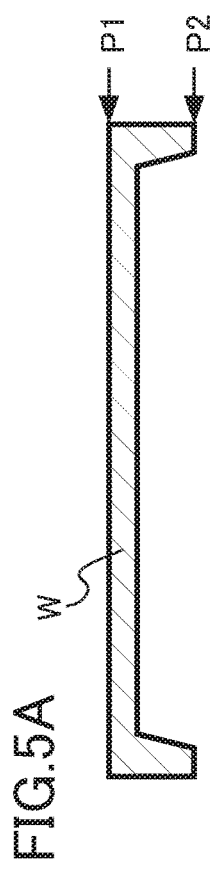

Next, an unillustrated acid resistant protection tape is stuck to the top plane of the silicon substrate W. Next, the lithography method is used to form resist patterns 52 while exposing a region corresponding to the dicing line 102 on the back plane side and a region of approximately 5 mm of the surroundings of the silicon substrate W on the back plane side (FIG. 5E).

Figure 5F:
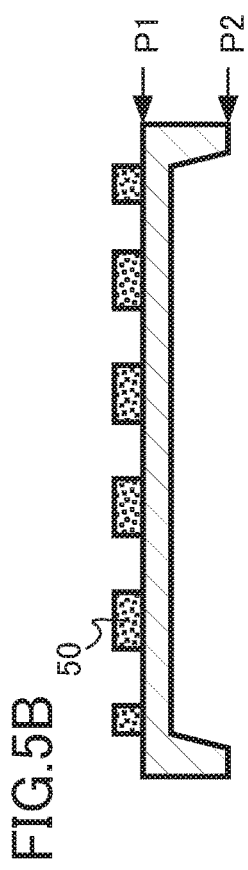

Next, a phosphoric/nitric/acetic acid solution is used to remove the second copper plated film 51b and the copper seed layer in the region corresponding to the dicing line 102 on the back plane side and the surroundings of the silicon substrate W on the back plane side. Next, after the resist pattern 52 is removed, the potassium hydroxide hydrogen peroxide solution is used to remove the titanium barrier metal layer exposed from the region corresponding to the dicing line 102 on the back plane side and the surroundings of the silicon substrate W on the back plane side (FIG. 5F).

Figure 5G:
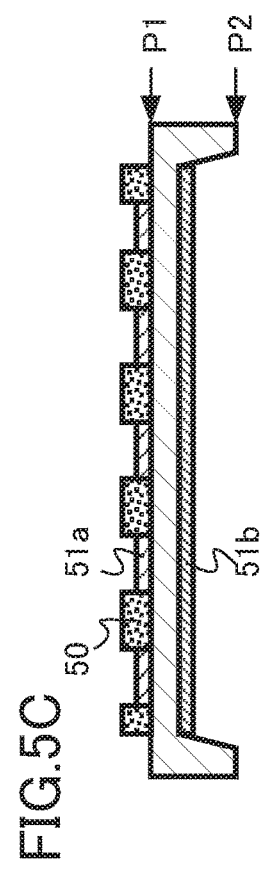

Next, an unillustrated dicing sheet is stuck to the back plane side of the silicon substrate W. Next, a thick portion of the surroundings of the silicon substrate W is separated and removed by a blade (FIG. 5G).

Figure 5H:
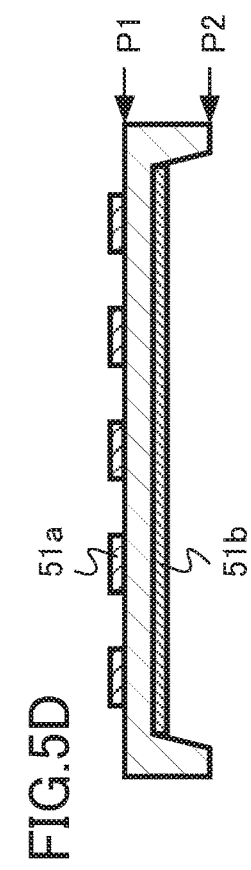

Next, blade dicing is used to cut the silicon substrate W along the dicing line 102 and separate a plurality of MOSFETs 101 as a plurality of semiconductor chips 10 (FIG. 5H). In addition, instead of the blade dicing, laser dicing or plasma dicing can be also used.

The semiconductor chip 10 according to the first embodiment is manufactured by the above manufacturing method.

Next, a function and an effect of the semiconductor device according to the first embodiment will be described.

A power semiconductor device has a problem that a rise in a temperature caused by heat generation of a semiconductor chip causes a degradation in reliability. For example, the heat generation may vary a threshold voltage of a transistor and destabilize a device operation. Furthermore, the heat generation may cause breakdown of the device.

To suppress a rise in the temperature caused by heat generation, copper having a high thermal conductivity is used for electrodes provided on top planes of semiconductor chips. The copper electrodes cool semiconductor chips, and suppress a rise in a temperature caused by heat generation of the semiconductor chips.

It is desirable to increase the thickness of the copper used for the electrodes to enhance an effect of cooling the semiconductor chips. However, increasing the thickness of the copper increases stresses of the electrodes and makes warps of the semiconductor chips large. A warp of a semiconductor chip may produce a crack in the semiconductor chip. The semiconductor chip is bonded by using, for example, a solder. The warp of the semiconductor chip is concerned to make it difficult to exhaust a gas produced in the solder in a solder reflow process, and produce a void in the solder. Therefore, increasing the thickness of copper used for an electrode is concerned to lower reliability of the power semiconductor device.

In the semiconductor device according to the first embodiment, electrodes containing copper as a main component and having the thicknesses equal to or more than 5 μm are provided on both planes of the semiconductor chip 10. That is, the top plane of the semiconductor chip 10 is provided with the source electrode pad 12 containing copper as a main component, and the gate electrode pad 14 containing copper as a main component. Furthermore, the back plane of the semiconductor chip 10 is provided with the drain electrode 13 containing copper as a main component.

By providing the electrodes containing thick copper as a main component on the both planes of the semiconductor chip 10, the effect of cooling the semiconductor chip 10 improves. Consequently, a rise in a temperature caused by heat generation in the semiconductor chip 10 is suppressed. Consequently, reliability of the semiconductor chip 10 improves.

Furthermore, stresses of the electrodes on the both planes of the semiconductor chip 10 balance out, and the warp of the semiconductor chip is suppressed. Consequently, even when the thicknesses of the electrodes of the copper are 5 μm or more, the warp of the semiconductor chip is suppressed. Consequently, it is possible to prevent the crack of the semiconductor chip 10 and the void in the solder from being produced, and improve reliability of the semiconductor chip 10.

In addition, when the thicknesses of the electrodes go below 5 μm, the effect of cooling the semiconductor chip 10 is insufficient. Furthermore, when the thicknesses of the electrodes are 50 μm or more, the stresses of the electrodes become too high, and the reliability of the semiconductor chip 10 lowers.

In the semiconductor chip 10 according to the first embodiment, the thickness t2 of the end of the source electrode pad 12 is preferably thicker than the thickness t1 of the center of the source electrode pad 12. For example, the solder is used for the second bonding layer 32 on the source electrode pad 12. By making the thickness t2 of the end thicker than the thickness t1 of the center, it is possible to prevent the solder from protruding to the outside of the source electrode pad 12 in the solder reflow process.

Furthermore, the thickness t4 of the end of the gate electrode pad 14 is preferably thicker than the thickness t3 of the center of the gate electrode pad 14. For example, the solder is used for the fourth bonding layer 34 on the gate electrode pad 14. By making the thickness t4 of the end thicker than the thickness t3 of the center, it is possible to prevent the solder from protruding to the outside of the gate electrode pad 14 in the solder reflow process.

The solder is prevented from protruding to the outside of the source electrode pad 12 and the gate electrode pad 14, so that it is possible to prevent short-circuiting between the source electrode and the gate electrode.

The thickness t2 of the end of the source electrode pad 12 is preferably 1.1 times or more and 1.5 times or less as the thickness t1 of the center of the source electrode pad 12. Furthermore, the thickness t4 of the end of the gate electrode pad 14 is preferably 1.1 times or more and 1.5 times or less as the thickness t3 of the center of the gate electrode pad 14. When the thickness goes below the range, short-circuiting is concerned to occur between the source electrode and the gate electrode. Furthermore, forming a shape whose thickness exceeds the range is difficult from a viewpoint of manufacturing.

The thicknesses of the ends of the source electrode pad 12 and the gate electrode pad 14 are controlled by adjusting the resist patterns and plating conditions for forming plated films by the electroplating method, for example.

Furthermore, in the semiconductor chip 10 according to the first embodiment, the thickness t6 of the end of the drain electrode 13 is preferably substantially the same as the thickness t5 of the center of the drain electrode 13. Consequently, when the solder that is a material of the first bonding layer 31 that bonds the drain lead 21 and the drain electrode 13 is reflowed, a gas exhaust path in the solder is hardly blocked. Consequently, it is possible to prevent the void from being produced in the solder.

The end of the semiconductor layer 11 includes a fine crack produced during dicing. If the drain electrode 13 contacts the region including the fine crack, the stresses of the electrodes expand the fine crack, influence an operation of the semiconductor chip 10 and lower reliability.

In the semiconductor chip 10 according to the first embodiment, the end of the drain electrode 13 is preferably closer to the inside by the predetermined distance d1 than the end of the semiconductor layer 11. Consequently, the drain electrode 13 does not contact the region including the fine crack. Consequently, it is possible to avoid a decrease in the reliability of the operation of the semiconductor chip 10.

Furthermore, the semiconductor chip 10 according to the first embodiment includes the thick electrodes on the both planes of the semiconductor chip 10, and consequently has an improved flexural strength. Consequently, it is possible to make the thickness of the semiconductor layer 11 thin and reduce the on-resistances of the MOSFETs.

As described above, according to the first embodiment, it is possible to realize the semiconductor chip 10 and the semiconductor package 100 that can improve reliability.

Second Embodiment

The semiconductor device according to the second embodiment differs from the first embodiment in that a first electrode pad and an electrode layer include at least one element selected from the group consisting of iron (Fe), cobalt (Co) and nickel (Ni). Hereinafter, contents that overlaps the contents of the first embodiment will not be described.

The semiconductor device according to the second embodiment is a semiconductor chip or a semiconductor module. The semiconductor chip is a power semiconductor chip used for power control and power supply. Furthermore, the semiconductor package is the power semiconductor package including the semiconductor chip.

The semiconductor chip and the semiconductor module according to the second embodiment differ from a semiconductor chip 10 and a semiconductor package 100 according to the first embodiment only in compositions of materials of a source electrode pad 12, a gate electrode pad 14 and a drain electrode 13.

In the semiconductor chip and the semiconductor module according to the second embodiment, the electrodes such as the source electrode pad 12, the gate electrode pad 14 and the drain electrode 13 are metals containing copper as a main component, and include at least one additional element selected from the group consisting of iron (Fe), cobalt (Co) and nickel (Ni).

Figure 6:
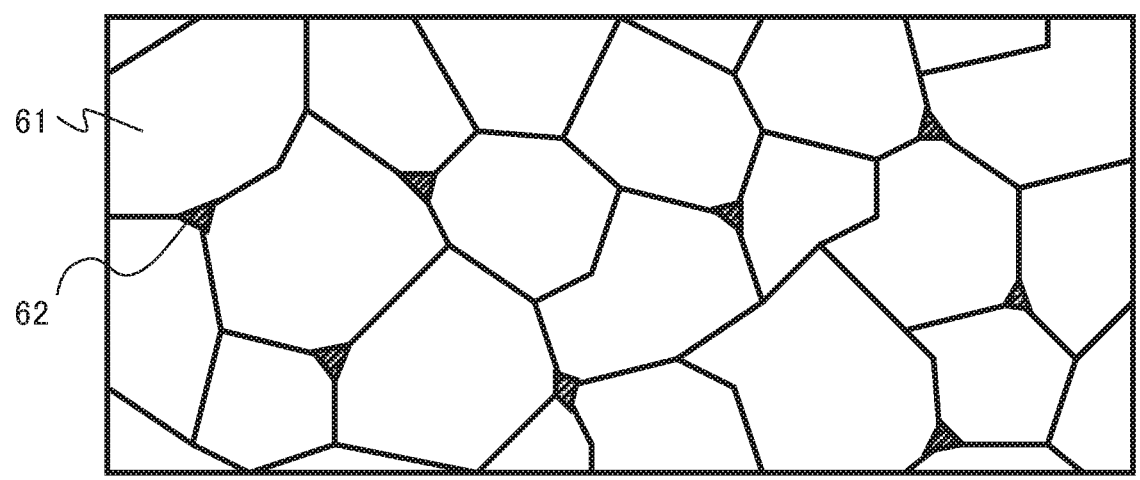
FIG. 6 is a schematic cross-sectional view of an electrode of a semiconductor device according to the second embodiment.

FIG. 6 is a schematic cross-sectional view of an electrode of the semiconductor device according to the second embodiment. FIG. 6 is a schematic cross-sectional view of part of the source electrode pad 12, the gate electrode pad 14 and the drain electrode 13.

The source electrode pad 12, the gate electrode pad 14 and the drain electrode 13 include copper crystals 61 and additional element segregation regions 62. The additional element segregation regions 62 exist at grain boundaries of the copper crystals. The additional element is segregated in the copper grain boundary. In the additional element segregation region 62, for example, alloy of copper and the additional element or a solid solution is formed.

A content of the additional element is, for example, 0.01 atom % or more and 0.4 atom % or less. In this regard, the content of the additional element is defined as a ratio of the amount of the additional element with respect to a total amount of the additional element and copper.

Next, an example of the semiconductor device manufacturing method according to the second embodiment will be described.

The semiconductor device manufacturing method according to the second embodiment differs from the semiconductor device manufacturing method according to the first embodiment in that, when the first metal film and the second metal film are formed by the electroplating method, at least one ion selected from the group consisting of a ferrous ion, a cobalt ion and a nickel ion is added to an electroplating solution. Hereinafter, part of contents that overlaps the contents of the semiconductor device manufacturing method according to first embodiment will not be described.

Figure 7:
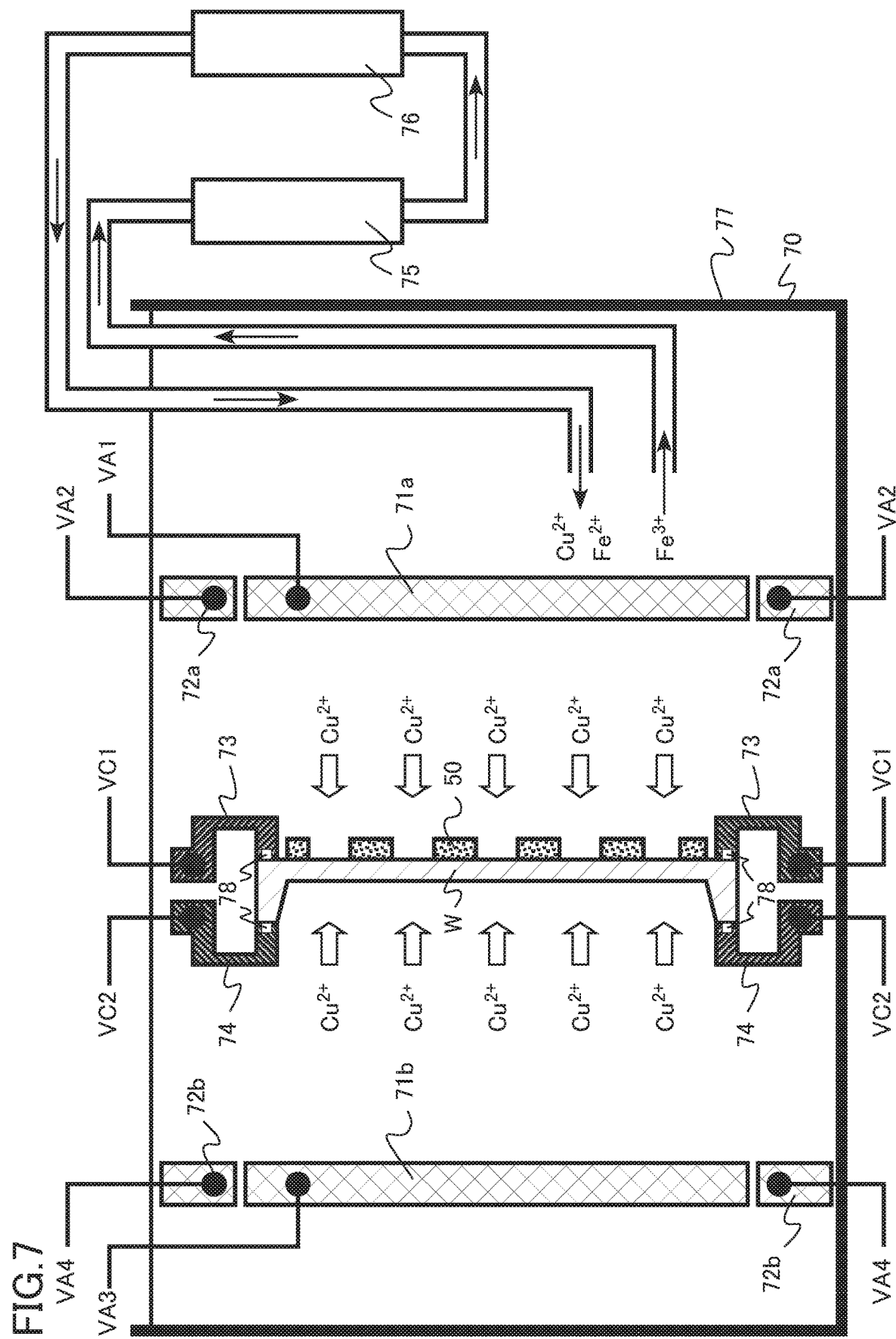
FIG. 7 is an explanatory view of a semiconductor device manufacturing method according to the second embodiment.

FIG. 7 is an explanatory view of the semiconductor device manufacturing method according to the second embodiment. A case where an additional element is iron will be described as an example below.

FIG. 7 illustrates a configuration of an electroplating device used for the semiconductor device manufacturing method according to the second embodiment. The electroplating device includes a plating bath 70, a first internal anode electrode 71a, a first external anode electrode 72a, a second internal anode electrode 71b, a second external anode electrode 72b, top plane cathode electrodes 73, back plane cathode electrodes 74, an ion concentration analyzer 75, a copper ion feeder 76 and ring holders 78. A plating solution 77 is stored in the plating bath 70.

A silicon substrate W is fixed to a cathode to form copper plated films on a source electrode and a gate electrode on a top plane of silicon substrate W, and on a back plane. The cathode includes the top plane cathode electrodes 73 and the back plane cathode electrodes 74. The silicon substrate W is fixed between the top plane cathode electrodes 73 and the back plane cathode electrodes 74.

A resist pattern 50 is formed on the top plane of the silicon substrate W. The resist pattern 50 includes openings formed on the source electrode and the gate electrode on the top plane of the silicon substrate W.

The top plane cathode electrodes 73 and the back plane cathode electrodes 74 can be applied different cathode voltages. The top plane of the silicon substrate W is applied a negative voltage VC1. The back plane of the silicon substrate W is applied a negative voltage VC2. For the negative voltage VC1 and the negative voltage VC2, direct current voltages or voltages obtained by superimposing a pulse wave voltage on the direct current voltage are used. The negative voltage VC1 and the negative voltage VC2 are set to appropriate voltages to realize desired thicknesses of copper plated films formed on the top plane and the back plane.

The ring holders 78 are provided between the top plane cathode electrodes 73 and the back plane cathode electrodes 74, and the silicon substrate W, to prevent the plating solution to go around to an end of the silicon substrate W. For material quality of the ring holder 78, a material resistant against the plating solution needs to be selected.

On a side of a top plane of the silicon substrate W, an anode includes the first internal anode electrode 71a and the first external anode electrode 72a. The diameter of the first internal anode electrode 71a is larger than the diameter of the silicon substrate W. The first external anode electrode 72a is provided in a ring shape around the first internal anode electrode 71a.

The first internal anode electrode 71a is applied a voltage VA1, and the first external anode electrode 72a is applied a voltage VA2. The voltage VA1 and the voltage VA2 are set to make an intra-plane distribution of the copper plated film formed on the top plane of the silicon substrate W uniform. The voltage VA1 and the voltage VA2 have positive potentials with respect to the cathode. That is, the anode potential is set higher than the cathode potential. For the voltage VA1 and the voltage VA2, direct current voltages or voltages obtained by superimposing a pulse wave voltage on the direct current voltage are used.

On a side of a back plane of the silicon substrate W, an anode includes the second internal anode electrode 71b and the second external anode electrode 72b. The diameter of the second internal anode electrode 71b is larger than the diameter of the silicon substrate W. The second external anode electrode 72b is provided in a ring shape around the second internal anode electrode 71b.

The second internal anode electrode 71b is applied a voltage VA3, and the second external anode electrode 72b is applied a voltage VA4. The voltage VA3 and the voltage VA4 are set to make an intra-plane distribution of the copper plated film formed on the back plane of the silicon substrate W uniform. The voltage VA3 and the voltage VA4 have positive potentials with respect to the cathode. That is, the anode potential is set higher than the cathode potential. For the voltage VA3 and the voltage VA4, direct current voltages or voltages obtained by superimposing a pulse wave voltage on the direct current voltage are used.

The voltage VA3 of the second internal anode electrode 71b can be set to a voltage different from the voltage VA1 of the first internal anode electrode 71a. Furthermore, the voltage VA4 of the second external anode electrode 72b can be set to a voltage different from the voltage VA2 of the first internal anode electrode 71a.

The voltage VA1, the voltage VA2, the voltage VA3 and the voltage VA4 are set to appropriate voltages to realize desired film thicknesses of copper plated films formed on the top plane and the back plane.

Iron (also referred to as Fe below) is added to the copper plated film (also referred to as a Cu plated film below) by adding a divalent iron ion (also referred to as $Fe^{2+}$ below) to the copper ion (also referred to as $Cu^{2+}$ below) of the copper plating solution (also referred to as a Cu plating solution below). $Cu^{2+}$ moves to the cathode, receives electrons from the cathode and precipitates as the Cu plated film on the silicon substrate W. On the other hand, when Fe2+ gives electrons to the anode on the top plane of the anode, $Fe^{2+}$ changes to a trivalent iron ion (also referred to as $Fe^{3+}$ below). Simultaneously, on the cathode side, $Fe^{2+}$ receives electrons from the top plane of the cathode, and is mixed as Fe in the Cu plated film.

When $Fe^{2+}$ becomes $Fe^{3+}$, a $Fe^{3+}$ concentration in the Cu plating solution becomes high. When the $Fe^{3+}$ concentration becomes high, a film formation speed of the Cu plated film becomes slow. When the ion concentration analyzer 75 monitors the $Fe^{3+}$ concentration in the Cu plating solution, and the $Fe^{3+}$ concentration reaches a certain concentration, $Fe^{3-}$ is fed to the copper ion feeder 76 and reacts with a Cu ball in the copper ion feeder 76. As a result of the reaction, $Fe^{3+}$ becomes $Fe^{2+}$ and Cu becomes $Cu^{2+}$. Furthermore, $Cu^{2+}$ and $Fe^{2+}$ are fed from the copper ion feeder 76 into the plating bath 70.

In addition, when cobalt (Co) or nickel (Ni) is added to the copper plated film, too, the same method as the method used for iron (Fe) can be performed.

After the copper plated film is formed on the silicon substrate W by using the electroplating device once, and before the copper plated film is formed on the next silicon substrate W, an electroplating device is cleaned.

Water at 60° C. or more and less than 100° C. is preferably used to clean the electroplating device. For example, the electroplating device is cleaned by water at 60° C. or more and less than 100° C., and then is cleaned by water at 4° C. or more and 30° C. or less. By using the water at 60° C. or more and less than 100° C. for cleaning, it is possible to shorten a time required for the cleaning.

Particularly when an iron ion, a nickel ion or a cobalt ion is added to the copper plating solution, the water at 60° C. or more and less than 100° C. is used to improve cleaning efficiency.

Next, a function and an effect of the semiconductor device according to the second embodiment will be described.

In the semiconductor chip and the semiconductor module according to the second embodiment, the source electrode pad 12, the gate electrode pad 14 and the drain electrode 13 contain copper as a main component, and include at least one additional element selected from the group consisting of iron (Fe), cobalt (Co) and nickel (Ni).

In case the electrodes contain copper as the main component and include iron, cobalt or nickel as an additional element, stresses of the electrodes becomes low.

Figure 8A:
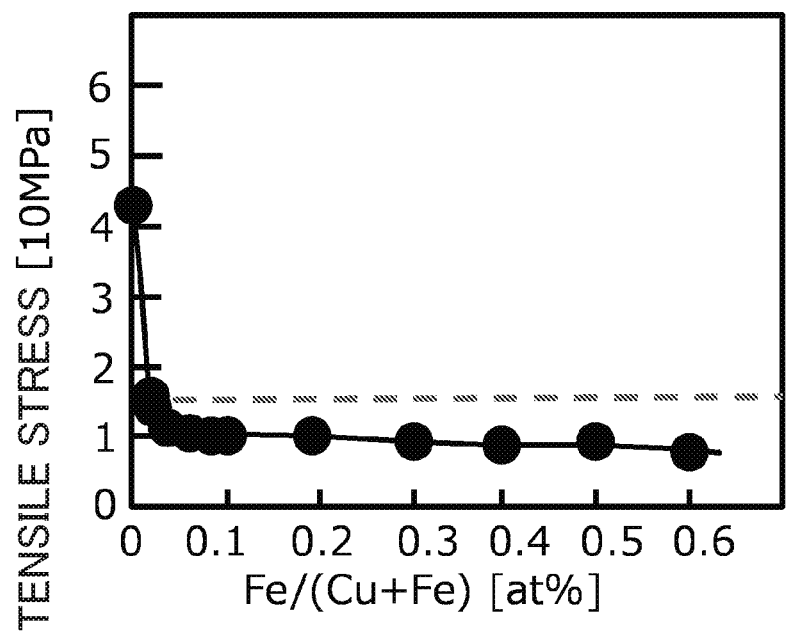
FIGS. 8A and 8B are explanatory views of a function and an effect of the semiconductor device according to the second embodiment.
Figure 8B:
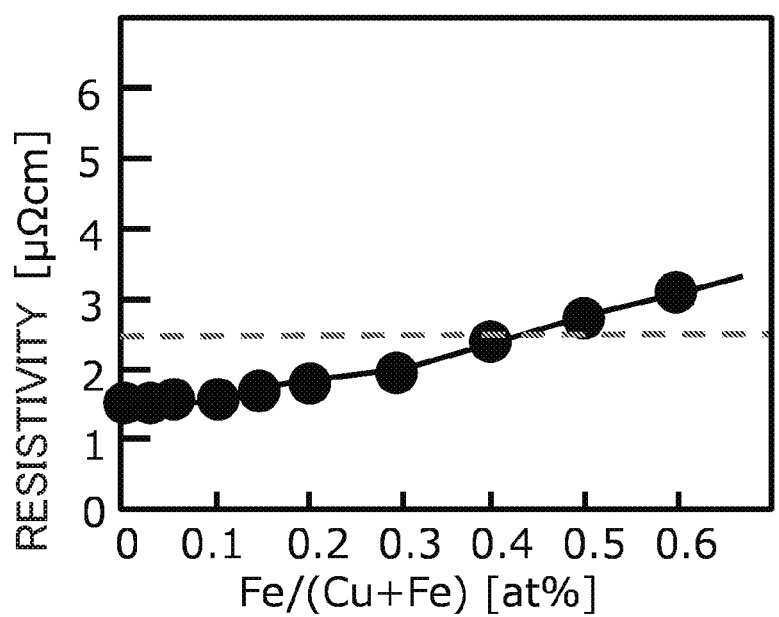

FIGS. 8A and 8B are explanatory views of the function and the effect of the semiconductor device according to the second embodiment. FIG. 8A illustrates a relationship between a tensile stress of a copper film, and a content of iron (Fe) in the copper film. FIG. 8B illustrates a relationship between a resistibility of the copper film and the content of the iron. The content of the iron is defined by a ratio (Fe/(Cu+Fe)) of the amount of the iron with respect to a total amount of the iron and the copper in the copper film.

As is clear from FIG. 8A, when 0.01 atom % or more of the iron is added, the tensile stress of the copper film is 15 MP or less. Furthermore, when 0.02 atom % or more of the iron is added, the tensile stress of the copper film is 10 MP or less. Addition of the iron suppresses growth of crystal grains of the copper, and the tensile stress lowers.

In this regard, as is clear from FIG. 8B, addition of the iron raises the resistibility of the copper film. When the addition amount of the iron is 0.4 atom % or less, the resistibility of the copper film is 2.5 μΩcm or less. When the addition amount of the iron is 0.3 atom % or less, the resistibility of the copper film is 2 μΩcm or less.

The semiconductor chip and the semiconductor module according to the second embodiment contain the iron as the additional element in the copper film of the electrodes to reduce the stresses of the electrodes. Hence, even when the semiconductor chip 10 is provided with the electrodes containing thick copper as a main component, the warp of the semiconductor chip is suppressed. Consequently, reliability of the semiconductor chip 10 improves.

The content of the iron in the copper film that forms the electrodes is preferably 0.01 atom % or more and 0.4 atom % or less, and is more preferably 0.02 atom % or more and 0.3 atom % or less. It is concerned that, when the content goes below the range, a stress reduction effect cannot be obtained. It is concerned that, when the content exceeds the range, a resistibility becomes too high and an on-resistance exceeds a permitted range.

Figure 9A:
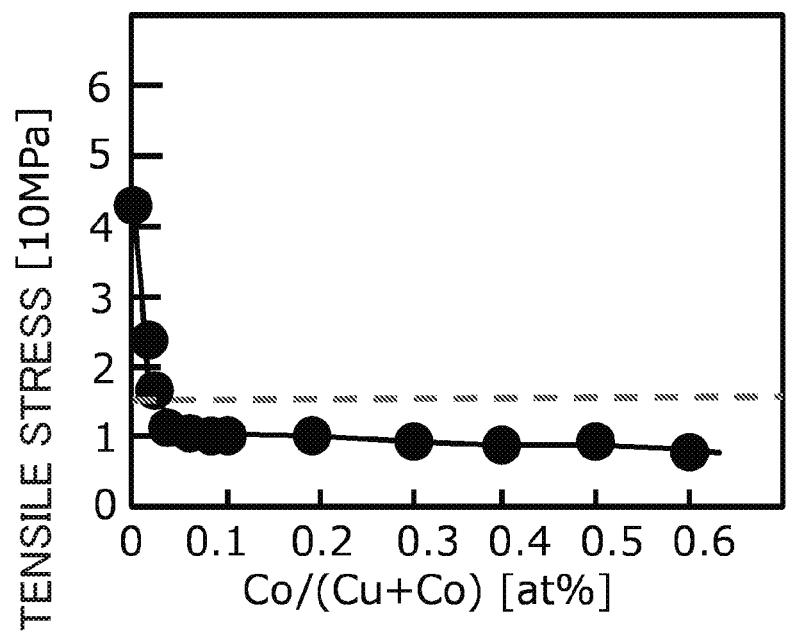
FIGS. 9A and 9B are explanatory views of the function and the effect of the semiconductor device according to the second embodiment.
Figure 9B:
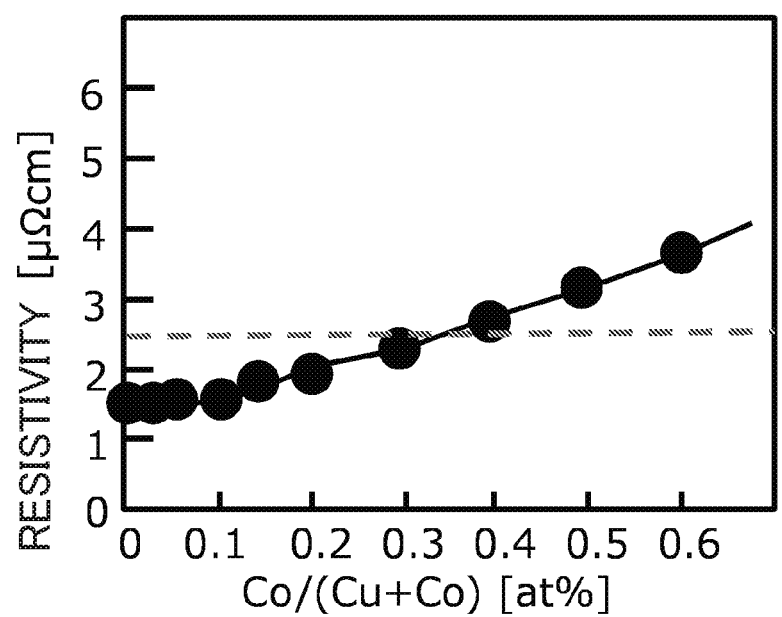

FIGS. 9A and 9B are explanatory views of the function and the effect of the semiconductor device according to the second embodiment. FIG. 9A illustrates a relationship between a tensile stress of a copper film, and a content of cobalt (Co) in the copper film. FIG. 9B illustrates a relationship between a resistibility of the copper film and the content of the cobalt. The content of the cobalt is defined by a ratio (Co/(Cu+Co)) of the amount of the cobalt with respect to a total amount of the cobalt and the copper in the copper film.

As is clear from FIG. 9A, when 0.02 atom % or more of the cobalt is added, the tensile stress of the copper film is 15 MP or less. Furthermore, when 0.025 atom % or more of the cobalt is added, the tensile stress of the copper film is 10 MP or less. Addition of the cobalt suppresses growth of crystal grains of the copper, and the tensile stress lowers.

In this regard, as is clear from FIG. 9B, addition of the cobalt raises the resistibility of the copper film. When the addition amount of the cobalt is 0.25 atom % or less, the resistibility of the copper film is 2.5 $\mu\Omega cm$ or less. When the addition amount of the cobalt is 0.2 atom % or less, the resistibility of the copper film is 2 $\mu\Omega cm$ or less.

The semiconductor chip and the semiconductor module according to the second embodiment contain the cobalt as the additional element in the copper film of the electrodes to reduce the stresses of the electrodes. Hence, even when the semiconductor chip 10 is provided with the electrodes containing thick copper as a main component, the warp of the semiconductor chip is suppressed. Consequently, reliability of the semiconductor chip 10 improves.

The content of the cobalt in the copper film that forms the electrodes is preferably 0.02 atom % or more and 0.25 atom % or less, and is more preferably 0.025 atom % or more and 0.2 atom % or less. It is concerned that, when the content goes below the range, a stress reduction effect cannot be obtained. It is concerned that, when the content exceeds the range, a resistibility becomes too high and an on-resistance exceeds a permitted range.

Figure 10A:
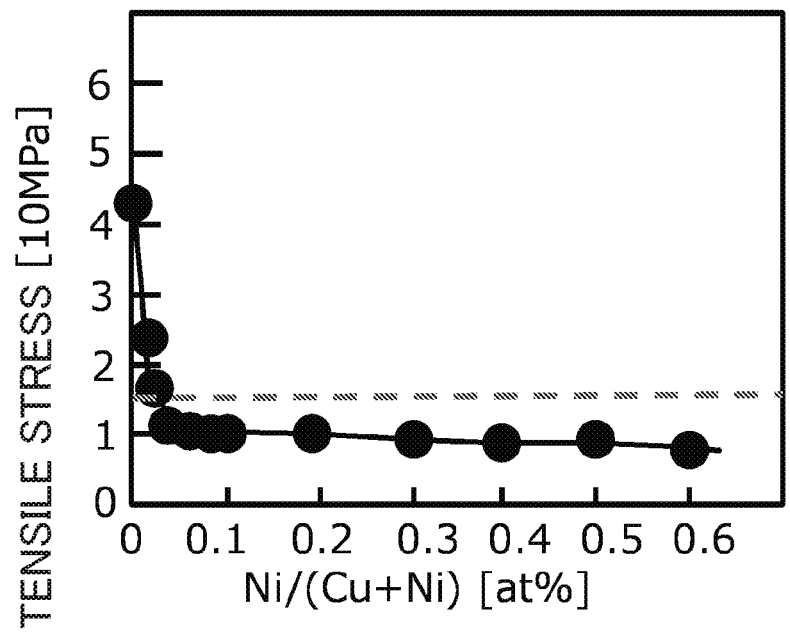
FIGS. 10A and 10B are explanatory views of the function and the effect of the semiconductor device according to the second embodiment.
Figure 10B:
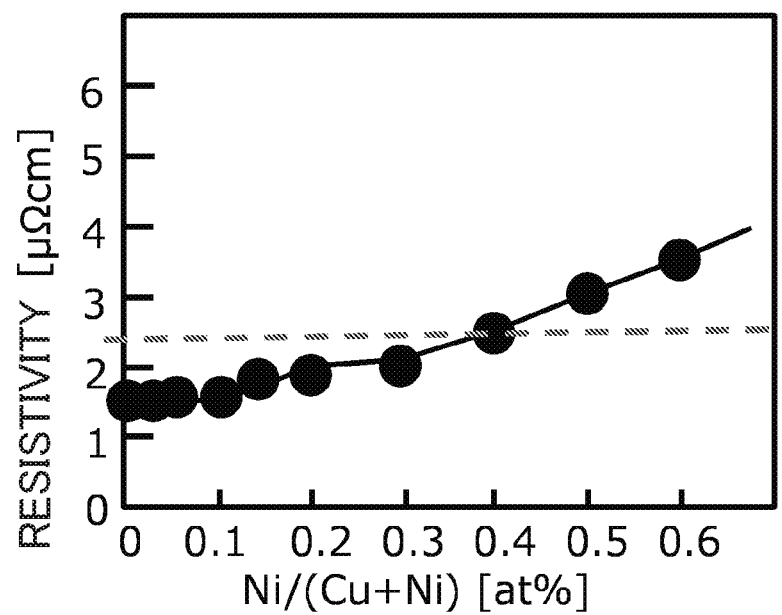

FIGS. 10A and 10B are explanatory views of the function and the effect of the semiconductor device according to the second embodiment. FIG. 10A illustrates a relationship between a tensile stress of a copper film, and a content of nickel (Ni) in the copper film. FIG. 10B illustrates a relationship between a resistibility of the copper film and the content of the nickel. The content of the nickel is defined by a ratio (Ni/(Cu+Ni)) of the amount of the nickel with respect to a total amount of the nickel and the copper in the copper film.

As is clear from FIG. 10A, when 0.02 atom % or more of the nickel is added, the tensile stress of the copper film is 15 MP or less. Furthermore, when 0.025 atom % or more of the nickel is added, the tensile stress of the copper film is 10 MP or less. Addition of the nickel suppresses growth of crystal grains of the copper, and the tensile stress lowers.

In this regard, as is clear from FIG. 10B, addition of the nickel raises the resistibility of the copper film. When the addition amount of the nickel is 0.4 atom % or less, the resistibility of the copper film is 2.5 $\mu\Omega cm$ or less. When the addition amount of the nickel is 0.3 atom % or less, the resistibility of the copper film is $2\mu\Omega cm$ or less.

The semiconductor chip and the semiconductor module according to the second embodiment contain the nickel as the additional element in the copper film of the electrodes to reduce the stresses of the electrodes. Hence, even when the semiconductor chip 10 is provided with the electrodes containing thick copper as a main component, the warp of the semiconductor chip is suppressed. Consequently, reliability of the semiconductor chip 10 improves.

The content of the nickel in the copper film that forms the electrodes is preferably 0.02 atom % or more and 0.4 atom % or less, and is more preferably 0.025 atom % or more and 0.3 atom % or less. It is concerned that, when the content goes below the range, a stress reduction effect cannot be obtained. It is concerned that, when the content exceeds the range, a resistibility becomes too high and an on-resistance exceeds a permitted range.

Each of the iron, the nickel and the cobalt that are the additional elements has the same effect. However, from a viewpoint of optimization of the tensile stress and the resistibility, the iron is the most preferable as the additional element, the nickel is the second most preferable and the cobalt is the third most preferable.

As described above, compared to the first embodiment, according to the second embodiment, it is possible to realize the semiconductor chip and the semiconductor package that can further improve reliability by reducing stresses of the electrodes.

Third Embodiment

A semiconductor device according to the third embodiment includes: a first electrode pad containing copper (Cu) as a main component, including at least one element selected from the group consisting of iron (Fe), cobalt (Co) and nickel (Ni) and having a thickness equal to or more than 5 $\mu m$ and less than 50 $\mu m$; an electrode layer; and a semiconductor layer provided between the first electrode pad and the electrode layer.

The semiconductor device according to the third embodiment differs from the second embodiment in that only a single plane of a semiconductor chip is provided with an electrode containing thick copper as a main component. Hereinafter, contents that overlaps the contents of the first embodiment and the second embodiment will not be described.

The semiconductor device according to the third embodiment is a semiconductor chip 30 or a semiconductor module. The semiconductor chip 30 is a power semiconductor chip used for power control and power supply. Furthermore, the semiconductor package is a power semiconductor package including the semiconductor chip 30.

Figure 11:
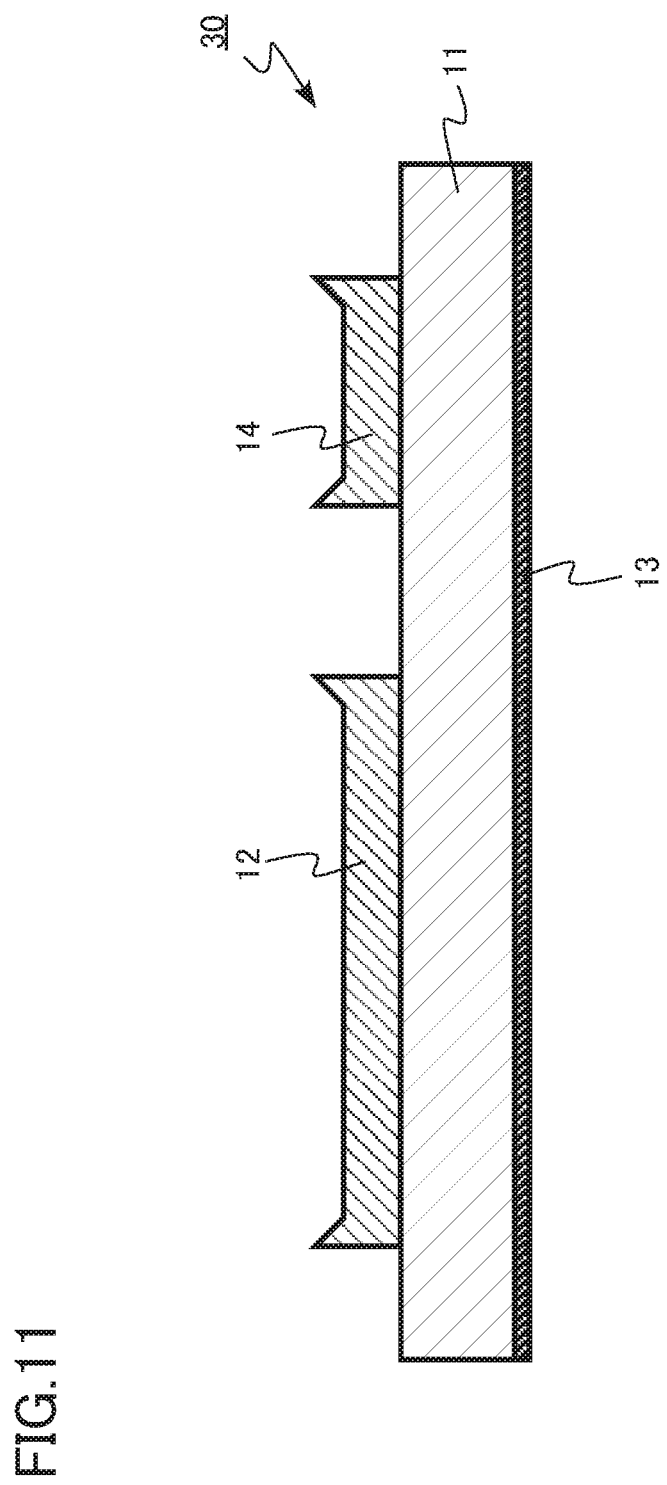
FIG. 11 is a schematic cross-sectional view of the semiconductor device according to the third embodiment.

FIG. 11 is a schematic cross-sectional view of the semiconductor device according to the third embodiment. FIG. 11 is the schematic cross-sectional view of the semiconductor chip 30.

A semiconductor layer 11 is a single crystal semiconductor. The semiconductor layer 11 is, for example, single crystal silicon, single crystal silicon carbide (SiC) or a single crystal nitride semiconductor.

The semiconductor layer 11 is provided between a source electrode pad 12 and a drain electrode 13. The semiconductor layer 11 is provided between a gate electrode pad 14 and the drain electrode 13.

The source electrode pad 12 is a metal containing copper as a main component. The source electrode pad 12 contains at least one additional element selected from the group consisting of iron (Fe), cobalt (Co) and nickel (Ni). The thickness of the source electrode pad 12 is equal to or more than 5 $\mu m$ and less than 50 $\mu m$.

The gate electrode pad 14 is a metal containing copper as a main component. The gate electrode pad 14 contains at least one additional element selected from the group consisting of iron (Fe), cobalt (Co) and nickel (Ni). The thickness of the gate electrode pad 14 is equal to or more than 5 µm and less than 50 µm.

The drain electrode 13 is a metal, a metal compound or a metal semiconductor compound. The drain electrode 13 is, for example, copper, nickel, titanium, titanium nitride, nickel silicide or titanium silicide. The thickness of the drain electrode 13 is equal to or more than 0.1 µm and is equal to or less than 2 µm.

For example, an unillustrated source electrode is provided between the source electrode pad 12 and the semiconductor layer 11. The source electrode is, for example, a metal different from copper. The source electrode is a metal containing aluminum as a main component.

For example, an unillustrated barrier metal layer is provided between the source electrode and the source electrode pad 12. The barrier metal layer is, for example, a metal or a metal nitride. The barrier metal layer is, for example, titanium, tantalum, titanium nitride, tantalum nitride and tungsten nitride.

In addition, the source electrode pad 12 may be provided on the semiconductor layer 11 without the source electrode. In this case, for example, an unillustrated barrier metal layer is provided between the semiconductor layer 11 and the source electrode pad 12. The barrier metal layer is, for example, a metal or a metal nitride. The barrier metal layer is, for example, titanium, tantalum, titanium nitride, tantalum nitride and tungsten nitride.

For example, an unillustrated gate electrode is provided between the gate electrode pad 14 and the semiconductor layer 11. The gate electrode is, for example, a polycrystalline semiconductor. The gate electrode is, for example, polycrystalline silicon.

For example, an unillustrated barrier metal layer is provided between the gate electrode and the gate electrode pad 14. The barrier metal layer is, for example, a metal or a metal nitride. The barrier metal layer is, for example, titanium, tantalum, titanium nitride, tantalum nitride and tungsten nitride.

An example of a semiconductor device manufacturing method according to the third embodiment will be described.

The semiconductor device manufacturing method according to the third embodiment includes: forming a resist pattern on a side of a first plane of a semiconductor substrate including a first plane and a second plane; and forming a metal film on the side of the first plane by an electroplating method by using an electroplating device, the metal film containing copper (Cu) as a main component and having the thickness equal to or more than 5 µm and less than 50 µm. When the metal film is formed by the electroplating method, at least one ion selected from a ferrous ion, a cobalt ion and a nickel ion is added to an electroplating solution. Hereinafter, part of contents that overlaps contents of the first embodiment will not be partially described.

Figure 12A:
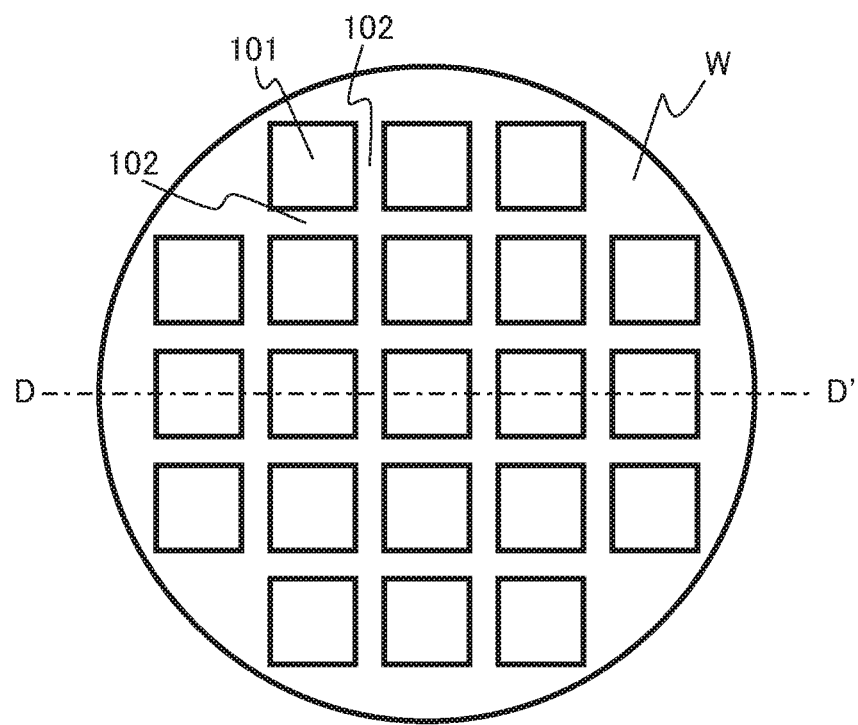
FIGS. 12A and 12B are views illustrating a semiconductor device manufacturing method according to the third embodiment.
Figure 12B:
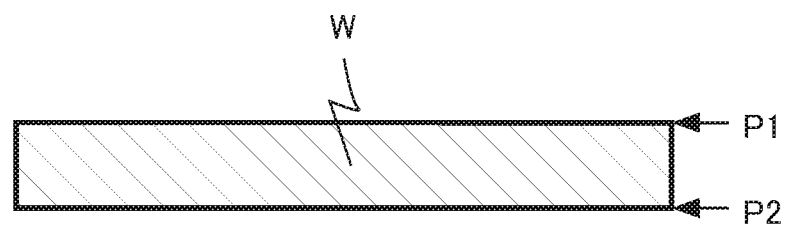

FIGS. 12A, 12B, 13A, 13B, 13C, 13D, 13E and 13F are views illustrating the semiconductor device manufacturing method according to the third embodiment. FIG. 12A is a top view of the semiconductor device being manufactured. FIG. 12B is a DD' cross-sectional view of FIG. 12A. FIGS. 13A, 13B, 13C, 13D, 13E and 13F are cross-sectional views of the semiconductor device being manufactured.

A plurality of MOSFETs 101 is formed on a silicon substrate W (FIG. 12A). The silicon substrate W is an example of the semiconductor substrate. The silicon substrate W includes a first plane P1 and a second plane P2. Hereinafter, the first plane P1 will be referred to as a top plane, and the second plane P2 will be referred to as a back plane. The thickness of the silicon substrate W is, for example, 750 µm.

A dicing line 102 having a predetermined width to be cut by dicing later is provided between the MOSFETs 101. A stacked protection film of an unillustrated oxide silicon film and polyimide film is formed on the top plane of the silicon substrate W.

The unillustrated source electrode and gate electrode are exposed from an opening of the stacked protection film. The source electrode and the gate electrode are metals containing aluminum as main components. The silicon substrate W from which the stacked protection film is removed is exposed on the dicing line 102.

An unillustrated barrier metal layer and seed layer are formed on the top plane of the silicon substrate W. The barrier metal layer and the seed layer are deposited by the PVD method. For example, the barrier metal layer is titanium whose thickness is 150 nm, and the seed layer is copper whose thickness is 500 nm.

Next, a lithography method is used to form a resist pattern 50 on the top plane of the silicon substrate W (FIG. 13A). A resist film thickness is, for example, 25 µm. The resist pattern 50 includes openings formed on the source electrode and the gate electrode on the top plane of the silicon substrate W.

Next, the electroplating method using the electroplating device forms copper plated films 51 whose thicknesses are 20 µm on the source electrode and the gate electrode on the top plane of the silicon substrate W (FIG. 13B). The copper plated films 51 become the source electrode pad 12 and the gate electrode pad 14. The copper plated film 51 contains at least one additional element selected from the group consisting of iron (Fe), cobalt (Co) and nickel (Ni).

Figure 14:
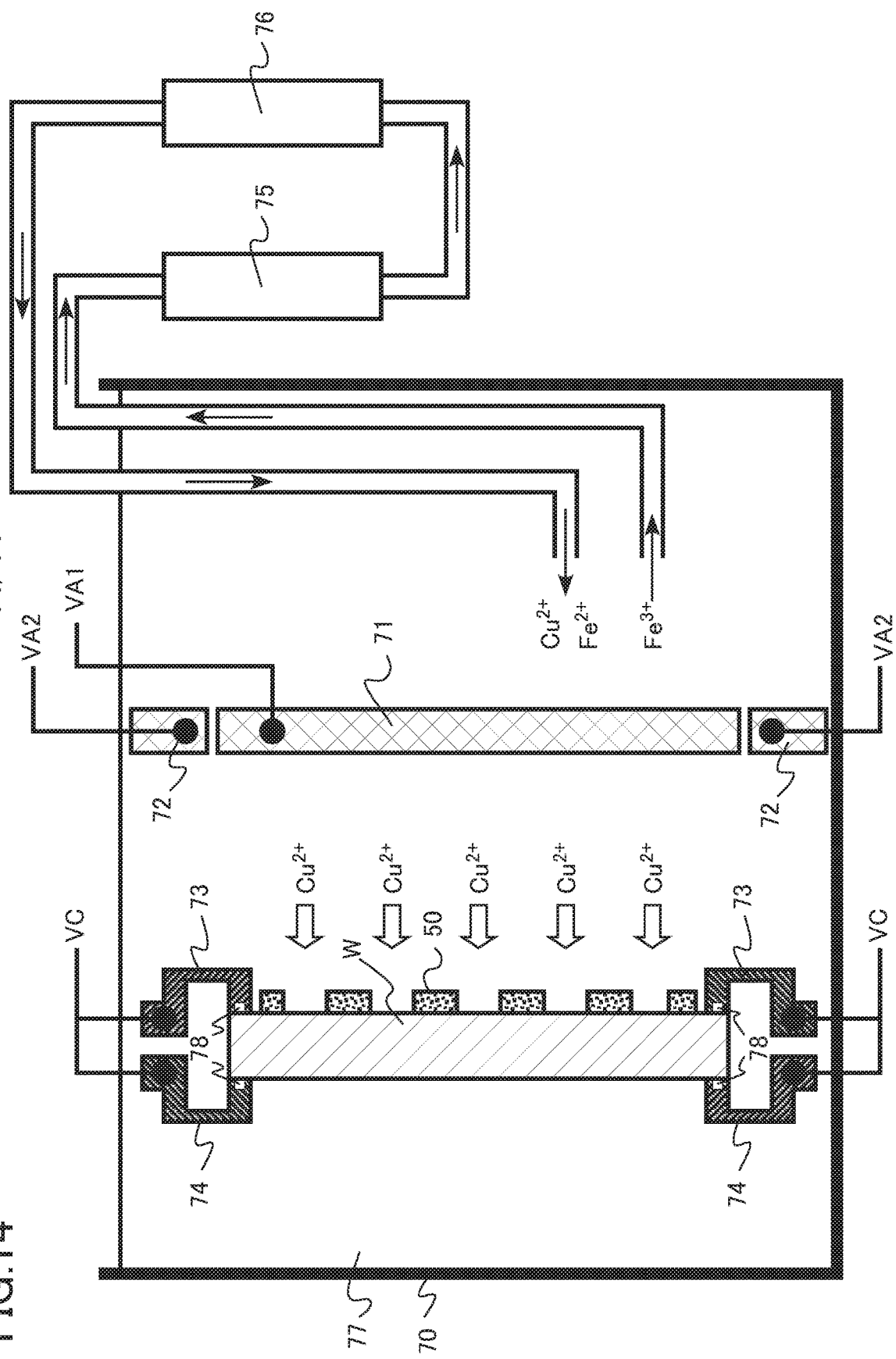
FIG. 14 is an explanatory view of the semiconductor device manufacturing method according to the third embodiment.

FIG. 14 is an explanatory view of the semiconductor device manufacturing method according to the third embodiment. FIG. 14 is the explanatory view of a manufacturing method for the copper plated films 51 containing the additional element by using the electroplating device. A case where an additional element is iron will be described as an example below.

FIG. 14 illustrates a configuration of the electroplating device used for the semiconductor device manufacturing method according to the third embodiment. The electroplating device includes a plating bath 70, an internal anode electrode 71, an external anode electrode 72, top plane cathode electrodes 73, back plane cathode electrodes 74, an ion concentration analyzer 75, a copper ion feeder 76 and ring holders 78. A plating solution 77 is stored in the plating bath 70.

The top plane cathode electrode 73 and the back plane cathode electrode 74 can be applied the same negative voltage VC. A divalent iron ion is added to a copper ion of a copper plating solution in the plating bath 70. The other points of the manufacturing method for the copper plated films 51 are the same as the method according to the second embodiment.

Next, the resist pattern 50 on the top plane of the silicon substrate W is removed by an organic solvent (FIG. 13C). Next, a copper seed layer covered by the resist pattern 50 on the top plane of the silicon substrate W is removed. Next, a potassium hydroxide hydrogen peroxide solution is used to remove a titanium barrier metal layer. The seed layer and the barrier metal layer are removed to electrically separate the source electrode pad 12 and the gate electrode pad 14.

Next, an unillustrated support member is provided on the top plane of the silicon substrate W, and the back plane of the silicon substrate W is grinded to make the silicon substrate W thin (FIG. 13D).

Next, a stacked film of a titanium film and a nickel film is formed on the back plane of the silicon substrate W by a spattering method (FIG. 13E). The stacked film is the drain electrode 13.

Next, a dicing sheet is stuck to the back plane side of the silicon substrate W. Next, the support member on the top plane of the silicon substrate W is removed.

Next, blade dicing is used to cut the silicon substrate W along the dicing line 102 and separate a plurality of MOSFETs 101 as a plurality of semiconductor chips 30 (FIG. 13F). In addition, instead of the blade dicing, laser dicing or plasma dicing can be also used.

According to the above manufacturing method, the semiconductor chip 30 according to the third embodiment is manufactured.

The semiconductor chip and the semiconductor package according to the third embodiment contain iron, cobalt or nickel as an additional element and therefore stresses of electrodes containing copper as a main component lower. Hence, even when only a single side of the semiconductor chip 30 is provided with the electrode containing copper as a main component, the warp of the semiconductor chip is suppressed. Consequently, reliability of the semiconductor chip 30 improves.

From a viewpoint of further suppression of the stresses, the thickness of the source electrode pad 12 and the thickness of the gate electrode pad 14 are preferably 30 μm or less and are more preferably 20 μm or less.

As described above, according to the third embodiment, it is possible to realize the semiconductor chip and the semiconductor package that can improve reliability by reducing stresses of the electrodes.

The first to third embodiments have described the examples of the cases where the MOSFET is used as the semiconductor chip. However, the semiconductor chip is not limited to this. As long as, for example, semiconductor chips allow a current to flow between upper and lower semiconductor chips, other power transistors and power diodes such as an IGBT (Insulated Gate Bipolar Transistor), an SBD (Shottky Barrier Diode) and a PIN diode are also applicable.

Furthermore, the first to third embodiments have described the examples of the semiconductor packages in which one semiconductor chip is sealed. However, the present disclosure is also applicable to a semiconductor module in which a plurality of semiconductor chips of same type or different types is sealed.

While certain embodiments have been described, these embodiments have been presented by way of example only, and are not intended to limit the scope of the inventions. Indeed, the semiconductor device and the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode pad containing copper as a main component and having a thickness equal to or more than 5 μm and less than 50 μm;
   an electrode layer containing copper as a main component and having a thickness equal to or more than 5 μm and less than 50 μm; and
   a semiconductor layer provided between the first electrode pad and the electrode layer, wherein
   an atomic ratio of copper included in the first electrode pad is larger than an atomic ratio of any other elements included in the first electrode pad, and an atomic ratio of copper included in the electrode layer is larger than an atomic ratio of any other elements included in the electrode layer.

2. The semiconductor device according to claim 1, wherein a thickness of an end of the first electrode pad is thicker than a thickness of a center of the first electrode pad.

3. The semiconductor device according to claim 1, wherein a thickness of an end and a thickness of a center of the electrode layer are a substantially same.

4. The semiconductor device according to claim 1, wherein the first electrode pad and the electrode layer include at least one element selected from the group consisting of iron (Fe), cobalt (Co) and nickel (Ni).

5. The semiconductor device according to claim 4, wherein a content of the at least one element in the first electrode pad and the electrode layer is 0.01 atom % or more and 0.4 atom % or less.

6. The semiconductor device according to claim 4, wherein the at least one element is segregated in a grain boundary of the copper.

7. The semiconductor device according to claim 1, further comprising a second electrode pad containing copper as a main component, and having a thickness equal to or more than 5 μm and less than 50 μm, wherein the semiconductor layer is provided between the second electrode pad and the electrode layer.

8. The semiconductor device according to claim 1, wherein a thickness of an end of the first electrode pad is between 1.1 times and 1.5 times a thickness of a center of the first electrode pad.

9. The semiconductor device according to claim 1, wherein at least one of the first electrode pad and the electrode layer includes iron (Fe).

10. A semiconductor device comprising:
    a first electrode pad containing copper as a main component and having a thickness equal to or more than 5 μm and less than 50 μm;
    an electrode layer containing copper as a main component and having a thickness equal to or more than 5 μm and less than 50 μm; and
    a semiconductor layer provided between the first electrode pad and the electrode layer, wherein
    a thickness of an end of the first electrode pad is thicker than a thickness of a center of the first electrode pad.

11. The semiconductor device according to claim 10, further comprising a second electrode pad containing copper as a main component, and having a thickness equal to or more than 5 μm and less than 50 μm, wherein the semiconductor layer is provided between the second electrode pad and the electrode layer.

12. The semiconductor device according to claim 10, wherein a thickness of an end of the first electrode pad is between 1.1 times and 1.5 times a thickness of a center of the first electrode pad.

13. The semiconductor device according to claim 10, wherein the first electrode pad includes at least one element selected from the group consisting of iron (Fe), cobalt (Co) and nickel (Ni).

14. The semiconductor device according to claim 13, wherein a content of the at least one element in the first electrode pad is 0.01 atom % or more and 0.4 atom % or less.

15. The semiconductor device according to claim 13, wherein the at least one element is segregated in a grain boundary of the copper.

* * * * *